United States Patent [19]

Tanka et al.

[11] Patent Number: 4,820,621

[45] Date of Patent: Apr. 11, 1989

[54] DEVELOPER SOLUTION FOR POSITIVE-WORKING PHOTORESIST COMPOSITIONS COMPRISING A BASE AND A NON-IONIC SURFACTANT

[75] Inventors: Hatsuyuki Tanka; Yoshiyuki Sato, both of Samukawa; Hidekatsu Kohara, Chigasaki; Toshimasa Nakayama, Hiratsuka, all of Japan

[73] Assignee: Tokyo Ohka Kogyo Co., Ltd., Kanagawa, Japan

[21] Appl. No.: 67,312

[22] Filed: Jun. 26, 1987

[30] Foreign Application Priority Data

Jul. 18, 1986 [JP] Japan .................................. 61-167897

[51] Int. Cl.$^4$ .......................... G03C 5/18; G03F 7/26
[52] U.S. Cl. .................................. 430/331; 430/309; 430/149
[58] Field of Search ...................... 430/309, 331, 149; 252/541, 547, 548

[56] References Cited

U.S. PATENT DOCUMENTS

| | | | |
|---|---|---|---|
| 3,868,254 | 2/1975 | Wemmers | 430/331 |
| 4,268,613 | 5/1981 | Okishi | 430/331 |
| 4,308,340 | 12/1981 | Walls | 430/331 |
| 4,348,954 | 9/1982 | Okishi | 430/331 |
| 4,374,920 | 2/1983 | Wanat et al. | 430/331 |
| 4,530,895 | 7/1985 | Simon et al. | 430/331 |
| 4,610,953 | 9/1986 | Hashimoto et al. | 439/326 |
| 4,613,561 | 9/1986 | Lewis | 430/331 |
| 4,711,836 | 12/1987 | Ferriera | 430/331 |

*Primary Examiner*—Paul R. Michl
*Assistant Examiner*—Patrick A. Doody
*Attorney, Agent, or Firm*—Hopgood, Calimafde, Kalil, Blaustein & Judlowe

[57] ABSTRACT

The aqueous developer solution for a positive-working photoresist composition comprises, as dissolved in an aqueous solvent, a water-soluble organic basic compound and a specific non-ionic surface active agent which may be an alkyl-substituted phenyl or naphthyl ether of polyoxyethyleneglycol in a specified concentration. The developer solution is advantageous in respect of the completeness of removal of film residua and scums from the substrate surface after development so that the patterned photoresist layer is imparted with greatly increased accuracy and fidelity of the pattern reproduction.

6 Claims, No Drawings

DEVELOPER SOLUTION FOR POSITIVE-WORKING PHOTORESIST COMPOSITIONS COMPRISING A BASE AND A NON-IONIC SURFACTANT

BACKGROUND OF THE INVENTION

The present invention relates to a developer solution for positive-working photoresist compositions. More particularly, the invention relates to a developer solution for positive-working photoresist compositions capable of giving a quite satisfactory patterned photoresist layer free from film residue or scums even in the areas of the finest pattern and greatly improving the resolving power in the reproduction of extremely fine through-holes.

As is known, the photolithographic processing prior to etching and diffusion treatment is an important step in many of the manufacturing processes of semiconductor devices and electronic components such as ICs, photomasks for the manufacture of ICs, printed circuit boards and the like as well as planographic printing plates. In the photolithographic processing, the surface of a substrate is uniformly coated with a so-called resist composition, i.e. a coating composition having sensitivity to actinic rays, e.g., ultraviolet light, X-rays, electron beams and the like, to give a thin layer sensitive to actinic rays which is irradiated pattern-wise with the actinic rays followed by development with a developer solution to form a patterned resist layer which serves to selectively protect the substrate surface from etching or diffusion of dopants.

When the above mentioned resist composition has sensitivity to ultraviolet light, it is usually called a photoresist composition which may be either positive-working or negative-working. A photoresist composition of the positive-working type has such a photosensitivity that the solubility of the composition in the developer solution is increased by exposure to light so that the patterned photoresist layer is formed on the areas unexposed to the ultraviolet where the composition is left undissolved. A photoresist composition of the negative-working type exhibits behavior of a sensitivity and solubility which is reverse to that of the positive-working ones. Typical positive-working photoresist compositions include those composed of an alkali-soluble novolac resin as a film-forming component and a naphthoquinone diazide compound as a photosensitizing component. While such a positive-working photoresist composition containing a naphthoquinone diazide compound can be developed by using an aqueous alkaline solution, the alkaline developer solution should be free from any metallic ions because contamination of semiconductor materials with metallic ions is very detrimental to the performance of the devices prepared from the semiconductor material. In this regard, the most widely used metal ion-free developer solution for positive-working photoresist compositions is an aqueous solution of, for example, tetramethylammonium hydroxide disclosed in IBM Technical Disclosure Bulletin, volume 3, No. 7, page 2009 (1970) or choline disclosed in U.S. Pat. No. 4,239,661.

Along with the recent progress in the technology of semiconductor devices with a requirement for finer and finer high-fidelity patterning of a line width of 1 $\mu$m or even finer to comply with the trend of increased density of integration in semiconductor devices, the photolithographic process of patterning using a positive-working photoresist composition also envisages a difficult problem. When patterning is desired of an extremely fine contact hole in a fine pattern, namely, it is usual that the above mentioned metal ion-free alkaline developer solution is admixed with a surface active agent with an object to increase the wettability of the substrate surface with the aqueous developer solution. One of the problems in the addition of a surface active agent to the developer solution is that film residua and scums sometimes occur on the exposed areas where the photoresist layer should be dissolved away as completely and cleanly as possible. Such an undesirable phenomenon cannot be completely avoided not to give a clean patterned photoresist layer even by an over-exposure or over-development. Although the film residua and scums can be removed by gently treating the surface with oxygen plasma or sputtering, no complete solution of the problem can be obtained thereby because such a treatment must be performed under well controlled troublesome conditions and is not quite efficient in respect of smooth removal of the scums or gives no uniform effect of treatment in very finely patterned areas having contact holes of about 1 $\mu$m or smaller diameter.

When subsequent processing of the substrate surface, such as dry etching, is performed with such film residua and scums removed only incompletely, disadvantages are naturally caused that the uniformity of etching is poor or accuracy of the dimensions or patterned form of the etched areas may be low.

SUMMARY OF THE INVENTION

The present invention accordingly has an object to solve the above described problems in the prior art and to provide a developer solution for patterning using a positive-working photoresist composition comprising an alkali-soluble novolac resin and a naphthoquinone diazide compound, which is capable of giving a quite satisfactory patterned photoresist layer even in the patterning of a very fine pattern having a line width of about 1 $\mu$m or smaller or extremely fine contact holes without leaving film residua and scums after development to contribute to the improvement of the dimensional accuracy in the step of subsequent etching.

Thus, the developer solution of the present invention for a positive-working photoresist composition comprises:

(a) water as a solvent;

(b) a water-soluble organic basic compound dissolved in the solvent; and (c) a non-ionic surface active agent which is a polyoxyethylene alkyl-substituted phenyl ether represented by the general formula

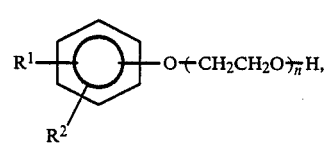

(I)

in which $R^1$ is an alkyl group having 5 to 15 carbon atoms, $R^2$ is a hydrogen atom or an alkyl group having 1 to 15 carbon atoms and n is a positive integer in the range from 5 to 60, or a polyoxyethylene alkyl-substituted or unsubstituted naphthyl ether represented by the general formula

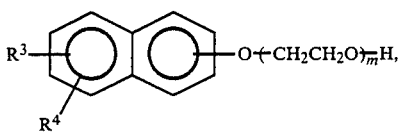

(II)

in which $R^3$ and $R^4$ are each, independently from the other, a hydrogen atom or an alkyl group having 1 to 15 carbon atoms and m is a positive integer in the range from 5 to 60, dissolved in the solvent in a concentration in the range from 50 to 5000 ppm by weight.

DETAILED DESCRIPTION OF THE PREFERRED EMBODIMENTS

As is understood from the above given summary of the invention, the characteristic feature of the inventive developer solution consists in the addition of a specific non-ionic surface active agent in a specified concentration.

The principal ingredient in the inventive developer solution is a water-soluble organic basic compound which may be any of known ones conventionally used in the developer solutions. Exemplary of such an organic basic compound are aryl and alkyl amines including primary, secondary and tertiary amines, of which the substituent groups may have a linear or branched chain-like or cyclic structure, alkylene diamines such as 1,3-diaminopropane, aryl amines such as 4,4'-diaminodiphenyl amine and heterocyclic basic compounds having a ring structure formed of 3 to 5 carbon atoms and 1 or 2 heteroatoms which may be nitrogen, oxygen or sulfur, such as pyrrole, pyrrolidine, pyrrolidone, pyridine, morpholine, pyrazine, piperidine, oxazole and thiazole, as well as lower-alkyl quaternary ammonium bases, of which particularly preferable are tetramethyl ammonium hydroxide and choline, i.e. trimethyl 2-hydroxyethyl ammonium hydroxide. These organic basic compounds as the component (b) are, either singly or as a combination of two kinds or more according to need, dissolved in the solvent as the component (a) which is water or a mixture mainly composed of water with addition of a minor amount of a water-miscible organic solvent. The concentration of the water-soluble organic basic compound as the principal ingredient of the developer solution should be in the range from 0.5 to 5% by weight.

The developer solution of the invention may optionally contain various known additives used in conventional developer solutions including, for example, wetting agents, stabilizers and solubilization aids as well as cationic surface active agents which serve to improve the selectivity in the solubility behavior of the positive-working photoresist layer between the areas exposed and unexposed to light. These additives may of course be added either singly or as a combination of two kinds or more according to need.

The characteristic ingredient in the inventive developer solution is the component (c) which is a non-ionic surface active agent which may be one or a combination of two kinds or more of those represented by the above given general formula (I) or (II). Several examples of such a non-ionic surface active agent include polyoxyethylene alkylphenyl ethers, polyoxyethylene dialkylphenyl ethers, polyoxyethylene naphthyl ethers, polyoxyethylene alkylnaphthyl ethers, polyoxyethylene dialkylnaphthyl ethers and the like though not limited thereto. Among the above named classes of the compounds, the polyoxyethylene dialkylphenyl ethers are preferred in view of the advantages of a smaller decrease of film thickness than with other compounds. Polyoxyethylene dinonylphenyl ethers are particularly preferred in respect of the availability and inexpensiveness.

The concentration of these non-ionic surface active agents in the inventive developer solution should be in the range from 50 to 5000 ppm by weight or, preferably, from 100 to 2000 ppm by weight. When the concentration thereof is lower than the above mentioned lower limit, the improvement obtained in the wetting power of the solution is too small so that substantially no improvement can be obtained in the resolving power of the resultant patterned photoresist layer. When the concentration thereof is too high, on the other hand, the developer solution is poor relative to the selectivity in the solubility behavior between the exposed and unexposed areas so that the fidelity in the pattern reproduction is decreased not to give an accurately reproduced pattern of the photoresist layer in addition to the problem of decrease in the residual film thickness in the unexposed areas.

The developer solution of the invention is applicable to any positive-working photoresist composition without limitations provided that the composition is soluble in the areas exposed to light but insoluble in the areas unexposed to light in an alkaline aqueous developer solution. More satisfactory results are obtained, however, when the positive-working photoresist composition is composed of an alkali-soluble novolac resin and a naphthoquinone diazide compound as the film-forming and photosensitizing ingredients, respectively.

As is understood from the above given detailed description, the developer solution of the invention, of which the principal ingredient is a water-soluble organic basic compound, characteristically contains a specific nonionic surface active agent having excellent infiltrability, washing power and solubilizing power to the positive-working photoresist composition under development. By virtue of this unique additive in the solution, the developer solution is imparted with greatly enhanced infiltrability even to the finest pattern and the increased washing and solubilizing power thereof serves to completely remove the film residua and scums on the substrate surface which may be a reaction product of the resin as a constituent of the composition and the photosensitizing compound. Consequently, the patterned photoresist layer obtained by using the inventive developer solution, which is free from film residua or scums, can be a high-fidelity reproduction of the mask pattern even in the most finely patterned areas having a line width of 1 μm or smaller or in the contact holes without deformation of the pattern or decrease in the resolving power.

In the following, examples are given to illustrate the developer solution of the invention in more detail.

EXAMPLES 1 TO 20

Developer solutions prepared in these examples were each an aqueous solution containing tetramethyl ammonium hydroxide in a concentration of 2.38% by weight and either one or two of the non-ionic surface active agents shown in the table below in a concentration in the range from 200 to 5000 ppm by weight as shown in the table. The values of n and m in the table correspond to the subscripts n and m in the general formulas (I) and (II), respectively.

Semiconductor silicon wafers of 4-inches diameter as the substrates were coated by use of a spinner with a positive-working photoresist composition containing a novolac resin and a naphthoquinone diazide compound (OFPR-5000, a product by Tokyo Ohka Kogyo Co.) in a thickness of 1.3 μm as dried followed by pre-baking on a hot plate at 110° C. for 90 seconds to form a uniform layer of the photoresist composition.

Each substrate was exposed pattern-wise to ultraviolet through a test chart reticle on an apparatus of minifying projection exposure manufactured by GCA Co. and then developed with one of the developer solutions in a stationary paddle-type developing machine at 23° C. for 65 seconds in a stationary condition followed by rinse with pure water. The table below shows the results of the development treatment including the relative sensitivity, which is a ratio of the photosensitivity to that without addition of the non-ionic surface active agent to the developer solution, the decrease in the film thickness in the areas unexposed to light and the visually examined surface condition relative to the scums in three ratings A, B and C corresponding to absolute absence of scums, a small amount of scums and a large amount of scums, respectively.

TABLE

| Example No. | Non-ionic surface active agent Ether-forming group | n or m | Concentration, ppm | Relative photosensitivity | Decrease in film thickness, nm | Scums |
| --- | --- | --- | --- | --- | --- | --- |
| 1 | 4-Pentylphenyl | 10 | 200 | 0.95 | 90 | B |
| 2 | 4-Heptylphenyl | 10 | 200 | 0.98 | 90 | A |
| 3 | 4-Nonylphenyl | 5 | 200 | 0.92 | 80 | B |
| 4 | 4-Nonylphenyl | 10 | 200 | 0.98 | 60 | A |
| 5 | 4-Nonylphenyl | 10 | 500 | 0.95 | 65 | A |
| 6 | 4-Nonylphenyl | 10 | 1000 | 0.93 | 70 | A |
| 7 | 4-Nonylphenyl | 10 | 2000 | 0.92 | 70 | A |
| 8 | 4-Nonylphenyl | 10 | 5000 | 0.90 | 120 | A |
| 9 | 4-Nonylphenyl | 20 | 500 | 0.96 | 60 | A |
| 10 | 4-Nonylphenyl | 40 | 500 | 0.97 | 55 | A |
| 11 | 4-Nonylphenyl | 60 | 500 | 0.97 | 50 | A |
| 12 | Dinonylphenyl | 16 | 500 | 1.00 | 35 | A |
| 13 | Pentyl-2-naphthyl | 10 | 400 | 0.98 | 60 | A |
| 14 | 4-Dodecylphenyl | 20 | 500 | 0.98 | 60 | A |
| 15 | 4-Pentadecylphenyl | 40 | 1000 | 1.01 | 50 | A |
| 16 | 4-Nonylphenyl Dinonylphenyl | 40 20 | 500 1000 | 0.98 | 50 | A |
| 17 | 4-Octylphenyl 4 Pentadecylphenyl | 15 40 | 400 1500 | 0.97 | 55 | A |
| 18 | Dinonylphenyl | 16 | 4000 | 0.99 | 40 | A |
| 19 | Dinonylphenyl | 30 | 5000 | 1.00 | 40 | A |
| 20 | Dinonylphenyl | 30 | 1000 | 1.00 | 35 | A |

COMPARATIVE EXAMPLE

The experimental procedure was substantially the same as in the preceding examples excepting omission of the nonionic surface active agent in the formulation of the developer solution. The results were that substantial amounts of scums and film residua were found on the substrate surface after development, in particular, in the finely patterned areas.

What is claimed is:

1. An aqueous developer solution for a positive working photoresist composition which comprises:
   (a) water or a mixture of water and a minor amount of a water-miscible organic solvent;
   (b) a water-soluble organic basic compound dissolved in component (a); and
   (c) a non-ionic surface active agent which is polyoxyethylene alkyl-substituted phenylether represented by the general formula

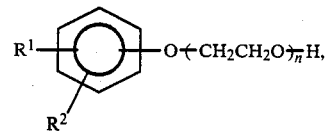

in which $R^1$ is an alkyl group having 5 to 15 carbon atoms, $R^2$ is a hydrogen atom or an alkyl group having 1 to 15 carbon atoms and n is a positive integer in the range from 5 to 60, or a polyoxyethylene alkyl-substituted or unsubstituted naphthyl ether represented by the general formula

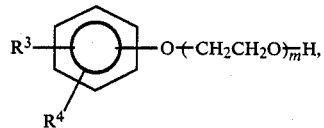

in which $R^3$ and $R^4$ are each, independently from the other, a hydrogen atom or an alkyl group having 1 to 15 carbon atoms and m is a positive integer in the range from 5 to 60, dissolved in component (a) in the range from 50–5000 ppm by weight.

2. The aqueous developer solution as claimed in claim 1 wherein the non-ionic surface active agent is a polyoxyethylene dialkylphenyl ether.

3. The aqueous developer solution as claimed in claim 2 wherein the polyoxyethylene dialkylphenyl ether is a polyoxyethylene dinonylphenyl ether.

4. The aqueous developer solution as claimed in claim 1 wherein the water-soluble organic basic compound is tetramethyl ammonium hydroxide or trimethyl 2-hydroxyethyl ammonium hydroxide.

5. The aqueous developer solution as claimed in claim 1 wherein the concentration of the non-ionic surface active agent is in the range from 50 to 5000 ppm by weight.

6. The aqueous developer solution as claimed in claim 1 wherein the concentration of the water-soluble organic basic compound is in the range from 0.5 to 5% by weight.

* * * * *

REEXAMINATION CERTIFICATE (1432nd)

United States Patent [19]

Tanka et al.

[11] B1 4,820,621

[45] Certificate Issued    Mar. 12, 1991

[54] DEVELOPER SOLUTION FOR POSITIVE-WORKING PHOTORESIST COMPOSITIONS COMPRISING A BASE AND A NON-TOXIC SURFACTANT

[75] Inventors: Hatsuyuki Tanka; Yoshiyuki Sato, both of Samukawa; Hidekatsu Kohara, Chigasaki; Toshimasa Nakayama, Hiratsuka, all of Japan

[73] Assignee: Tokyo Ohka Kogyo Co., Ltd.

Reexamination Request:
No. 90/002,004, Apr. 18, 1990

Reexamination Certificate for:
Patent No.: 4,820,621
Issued: Apr. 11, 1989
Appl. No.: 67,312
Filed: Jun. 26, 1987

[30]    Foreign Application Priority Data

Jul. 18, 1986 [JP]    Japan .................................. 61-167897

[51]  Int. Cl.$^5$ ............................ G03C 5/18; G03F 7/26
[52]  U.S. Cl. .................................... 430/331; 430/309; 430/149

[58]  Field of Search ....................... 430/331, 309, 149; 252/541, 547, 548

[56]           References Cited
           U.S. PATENT DOCUMENTS 3,868,254  2/1975  Wemmers ................................. 96/75
4,239,661  12/1980  Muraoka et al. ..................... 252/541

FOREIGN PATENT DOCUMENTS 0186184  7/1986  European Pat. Off. .

*Primary Examiner*—Charles L. Bowers, Jr.

[57]           ABSTRACT

The aqueous developer solution for a positive-working photoresist composition comprises, as dissolved in an aqueous solvent, a water-soluble organic basic compound and a specific non-ionic surface active agent which may be an alkyl-substituted phenyl or naphthyl ether of polyoxyethyleneglycol in a specified concentration. The developer solution is advantageous in respect of the completeness of removal of film residua and scums from the substrate surface after development so that the patterned photoresist layer is imparted with greatly increased accuracy and fidelity of the pattern reproduction.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–6 are cancelled.

New claims 7–11 are added and determined to be patentable.

7. *An aqueous developer solution for a positive photoresist composition for use in the manufacture of semiconductors comprising essentially:*
   *(a) water as a solvent*
   *(b) a water-soluble organic basic compound dissolved in the solvent; and*
   *(c) 50 to 5,000 ppm of a non-ionic surface active agent of a polyoxyethylene dialkylphenyl ether represented by the general formula*

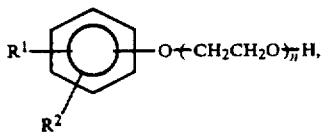

*in which $R^1$ is an alkyl group having 5 to 15 carbon atoms, $R^2$ is an alkyl group having 1 to 15 carbon atoms and n is a positive integer in the range of 5 to 60.*

*8. The aqueous developer solution as claimed in claim 7, wherein the polyoxyethylene dialkylphenyl ether is a polyoxyethylene dinonylphenyl ether.*

*9. The aqueous developer solution as claimed in claim 7, wherein the water-soluble organic basic compound is tetramethyl ammonium hydroxide or trimethyl 2-hydroxyethyl ammonium hydroxide.*

*10. The aqueous developer solution as claimed in claim 7, wherein the concentration of the water-soluble organic basic compound is in the range of 0.5 to 5% by weight.*

*11. The aqueous developer solution as claimed in claim 7, wherein the concentration of the non-ionic surface active agent is in the range of 100 to 2000 ppm.*

* * * * *